July 21, 1953 R. F. ROMERO 2,646,500

HIGH-FREQUENCY TUNER

Filed March 15, 1947 3 Sheets-Sheet 1

INVENTOR.

Robert F. Romero

BY H. G. Grover

ATTORNEY

July 21, 1953 R. F. ROMERO 2,646,500

HIGH-FREQUENCY TUNER

Filed March 15, 1947 3 Sheets-Sheet 2

INVENTOR.
Robert F. Romero

BY H. S. Grover
ATTORNEY

HIGH-FREQUENCY TUNER

Filed March 15, 1947 3 Sheets-Sheet 3

INVENTOR.
Robert F. Romero
BY W. S. Grover
ATTORNEY

Patented July 21, 1953 2,646,500

UNITED STATES PATENT OFFICE 2,646,500

HIGH-FREQUENCY TUNER

Robert F. Romero, Cos Cob, Conn., assignor to Radio Corporation of America, a corporation of Delaware Application March 15, 1947, Serial No. 735,003

3 Claims. (Cl. 250—20)

The present invention relates to high frequency wave transmission and tuning arrangements and, more particularly, but not necessarily exclusively, to novel wave transmission and tuning apparatus and tuning controls for such apparatus. The present invention, in one of its aspects, involves a novel transmission line termination and a closely associated amplifier. The invention also is concerned with a novel high frequency tuner of the multiple step or station type which operates single ended from a balanced input. The balanced input just mentioned is preferably obtained by the novel wave transmission arrangement of this invention. The single ended or unbalanced arrangement considerably simplifies the construction of a tuner embodying the invention and enables the use of compound coupling in a novel manner to improve the image rejection. Tuning may be accomplished by a rotary switch. The single ended or unbalanced construction is valuable since it minimizes the number of rotary switching sections, or "wafers" required in the rotary switch.

The principal object of the present invention is to provide a novel antenna input circuit closely associated with a novel high frequency tuner.

Another object is to provide a stage of amplification having a novel input arrangement for terminating a high frequency transmission line.

A further object is to provide a novel high frequency tuner of single ended construction.

Still another object is to provide tunable inductance elements which are novel in character.

A still further object is to provide a novel arrangement of elements in a tuner for minimizing the interfering effects other than the desired signal.

A still further object is to provide a novel inductor having either a positive or a negative temperature coefficient.

Other and more specific objects of the invention will become apparent from a consideration of the following specification and claims in connection with the accompanying drawings in which:

Figure 1:
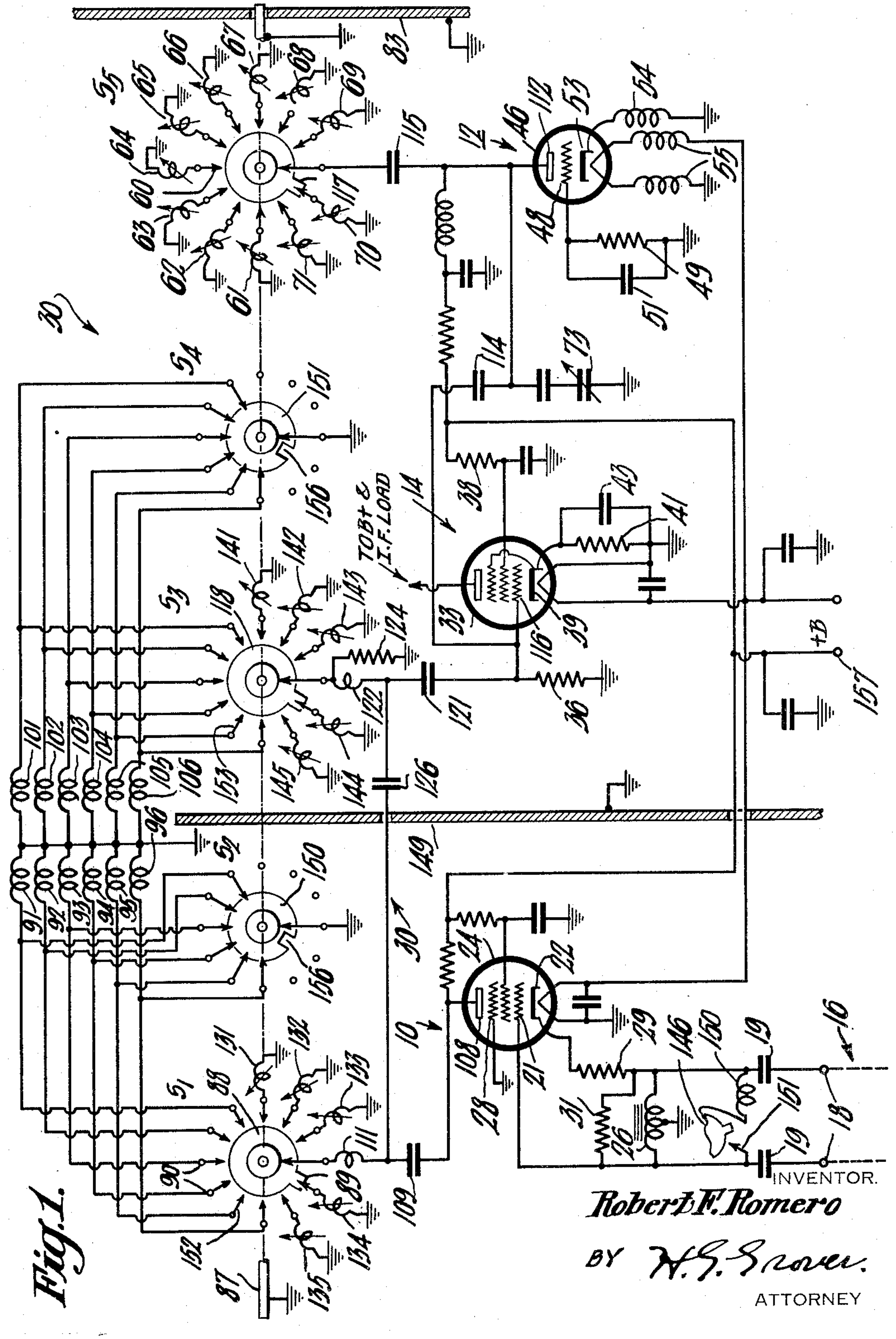
Fig. 1 is a schematic circuit diagram of the novel tuner of the invention designed to operate as a superheterodyne receiver.

Referring for the present to Fig. 1 of the drawings, which shows the electrical features of an embodiment of the tuner selected for illustrating the invention, it will be seen that the R. F. (radio frequency) amplifier 10, oscillator 12 and mixer 14 of a superheterodyne receiver are shown schematically. The tuner selected as an illustrative embodiment of the invention provides for the selection of predetermined radio frequency signals transmitted, for instance, over signal channels ranging from 44 mc. (megacycles) to 216 mc. While the tuner may be designed to respond to a greater or lesser number of channels that shown is designed for 11 such channels. These figures are given solely by way of example, since it will be understood that, while the tuner of the illustrative embodiment is designed for these high frequencies, yet numerous features of the invention are equally applicable in tuners operating in a higher or a lower frequency range. Moreover, while a superheterodyne type of receiver has been referred to in the brief description so far given in connection with Fig. 1 of the drawings, there are features present therein to be pointed out hereinafter, which are an important part of applicant's invention and which may be used in variable impedance devices generally, testing instruments, and the like.

Before a detailed description of the tuner is given, novel features of the termination of the antenna transmission line 16 and the coupling to the R. F. amplifier stage 10 of the invention will be described. The simplified unbalanced or single ended construction of the tunable circuit employed for the oscillator 12 and the mixer 14 requires a special antenna input circuit which is provided by the R. F. amplifier 10 and its input circuit. A tuned antenna transformer with its increased complexity is not needed.

The R. F. amplifier 10 terminates the antenna transmission line 16 properly without the use of a resistor. This phase of the invention concerned with the amplifier depends primarily upon the transconductance value of the tube used with the amplifier circuits. On the input side, balance is presented to ground. The plate circuit of the R. F. tube is single ended. Oscillator radiation is minimized so that interference with other apparatus, such as television receivers, is avoided or is reduced to acceptable limits. Considering the input circuit of the amplifier stage, terminals 18 are shown to which the antenna transmission line is to be connected. Coupling condensers 19 serve to connect the terminals 18, and hence the transmission line to the grid 21 and cathode 22 of a tube 24, which is the amplifying device of the stage 10. It is to be noted that the grid 21 does not have any control bias supplied thereto since such bias may have some effect on input impedance on the tube. When the termination of the system is not determined by the tuner, or in other circumstances, control bias may be applied to the grid 21. A center tapped coil 26, preferably wound with small wire on an iron core in order to attain high coupling between either half of the coil, is connected across the leads from the condensers 19 and hence across the antenna terminals 18. The inductance of this coil and the grid to cathode capacitance of the tube 24 provide a circuit which is resonant within the signal frequency region or band. When the grid to ground and cathode to ground capacitances of the tube are equal they cancel undesired currents which are unbalanced with respect to ground.

It will be noted that the suppressor grid 28 of the tube is connected externally of the tube to ground. This minimizes feed-back of oscillator energy to the antenna via the large plate-suppressor capacity. Suitable tubes are the 6BA6 or 6AU6 types. In order to minimize the effect of input loading due to transit time on the transmission line termination a degenerative resistance 29 is included in the cathode circuit. Transconductance may vary somewhat in production tubes and this objection is overcome in a practical and useful manner by the use of cathode degeneration which tends to stabilize the transconductance.

The previously mentioned center tapped coil 26 rejects unbalanced undesired currents by presenting a low impedance to ground to such currents and provides a D. C. (direct current) return path for the cathode current. The coil resonates with the input tube capacity as mentioned above at a point which is the geometric mean frequency between signal frequency bands receivable in the lower frequency range setting of the tuner. Solely by way of example, if the tuner of this invention is designed, as above stated, for the selection of 11 radio frequency signals or channels in the range given, the resonant point is the geometric frequency between 44 mc. to approximately 88 mc. On the present frequency assignment these are designated channels one and six.

In the illustrative arrangement of Fig. 1 a rotary channel selecting switch 30 is shown by way of example and, because of its availability, a standard 12-position wave-change switch is shown schematically. It will be understood, however, that while the illustrative arrangement allows selection of any eleven of the presently available thirteen television channels, provision may be made for receiving a greater or less number than eleven within the scope of the invention as stated previously.

A resistor 31 may be shunted across the coil 26 to provide a lower effective terminating impedance if required.

Before describing and discussing the frequency selective network which is controlled in the illustrative embodiment by the rotary switch 30, the circuits of the mixer 14 will be described. The mixer comprises a tube 33 which is preferably a pentode type as shown. A suitable type of tube is the 6AG5, for example. Grid-leak biasing for this tube is employed which is provided by a grid-leak resistor 36. A series dropping resistor 38 for the screen is employed. Grid-leak biasing and the series dropping resistor for the screen are used because of the self-regulating characteristics which result in the $G_c$ (conversion transconductance) being less critical to the amplitude of the injected oscillator voltage. The cathode 39 is returned to ground through a resistor 41 by-passed by a condenser 43 rather than being directly grounded to protect the tube in the event of failure of the local oscillator. If the cathode resistor 44 is not by-passed, the overall gain is reduced because of the degenerative effect of the resistor on the I. F. (intermediate frequency) signal and the lowered $G_c$ caused by reduction in peak $G_m$ obtainable at the positive peak of the local oscillator injected voltage.

The oscillator 12 is a simple Colpitts oscillator employing a triode tube 46 with its grid 48 grounded through a resistor 49 by-passed by a condenser 51. The cathode 53 of the tube is isolated by a choke 54, one end of which is connected to ground. The heater of the tube is isolated by a bifilar choke 55.

With an intermediate frequency selected for example in the range between 21.25 and 21.75 mc. for television sound, the local oscillator frequency would be varied from 71.0 mc. to 71.5 mc. for channel one to the range between 109.0 and 109.5 mc. for channel six, and in the range from 201.0 to 201.5 mc. for channel seven to the range between 237.0 and 237.5 mc. for channel thirteen.

Figure 2:
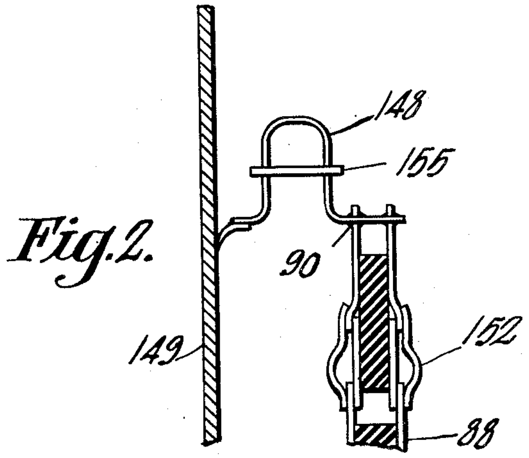
Fig. 2 shows details of a novel inductance element constructed in accordance with the invention.
Figure 3:
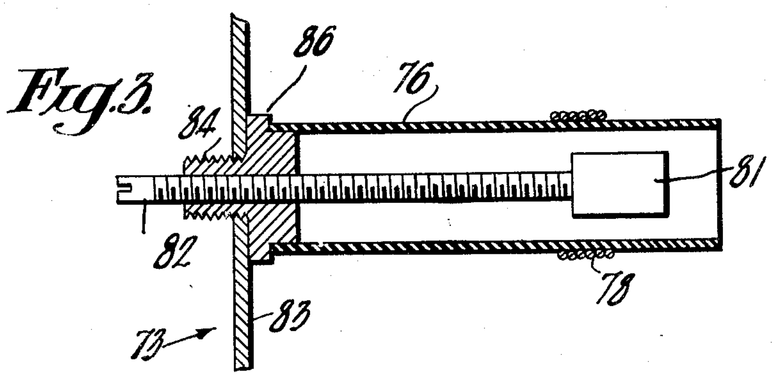
Fig. 3 is a detailed view in cross-section showing an oscillator coil constructed in accordance with the invention.

Each channel to which the tuner may be set by the means yet to be described has a separate adjustable oscillator inductance, these inductances being designated 61 to 71. For the lower six channels, the inductances 61 to 66 may comprise an enameled wire coil which is close wound on a form. These coils may be tuned by a movable plunger of brass, for example, or iron or comminuted iron. Fig. 3 to be described in detail shows the preferred form of the inductances 61 to 66. For the upper five channels in the illustrative embodiment, adjustable inductances 67 to 71 are of the type shown in Fig. 2 of the drawings which will be described more in detail in connection with the description of the several frequency selective networks.

The mounting for the stationary contacts 60 of the switch section $S_5$ of the rotary switch 30 is preferably of ceramic material and may be of "wafer" form which is usual in the ordinary band-selector or wave change switches of radio receivers. Ceramic material improves frequency stability. The mountings for the contacts of the sections $S_1$ to $S_4$ may be of Bakelite. Vernier tuning is accomplished by a variable air condenser 73.

The previously mentioned wave-change switch 30 has a positive temperature coefficient of both capacitance and inductance. It is, therefore, desirable and perhaps necessary to compensate by the use of negative-coefficient condensers. The various condensers associated with the oscillator circuit each has a negative temperature coefficient. Referring to Fig. 3 showing one of the inductances 67 to 71, it is seen to comprise a coil form 76 around which the inductance in the form of wire coil 78 is wound. A tuning "slug" or body of metal in the form of a brass, for example, core 81 is carried by an adjusting screw 82 which may be of steel. A metallic mounting plate 83 receives the externally threaded boss 84 of a nut 86 in threaded engagement. The screw is received adjustably in an internally threaded hole in the nut 86. The mounting plate 83 may be any portion of the tuner structure (not shown in detail for the sake of simplicity of illustration), but its location is indicated schematically in Fig. 1 of the drawings.

The oscillator inductances 61 to 66 for the low frequency channels can be made with either a positive or negative temperature coefficient as is evident from Fig. 3. If the coil form 76 has a high thermal expansion coefficient relative to the mounting screw 82, the coil 78 moves toward the core 81 during heating, tending to reduce the coil inductance. A plastic coil from 76 with a high coefficient of thermal expansion and a steel screw 82 to support the slug 81 is an example of a workable arrangement where the coils associated with the oscillator circuit each can be made with a negative temperature coefficient as stated above. Polystyrene or cellulose acetate butyrate may be used for the form 76 where a negative temperature coefficient is desirable. The wire size and distance of the coil 78 from the mounting plate 83 are both factors in determining the amount of compensation which is present.

The frequency selective circuits and the manner in which they operate in conjunction with the R. F. amplifier 10, the oscillator 12 and the mixer 14 will now be described. The tuner assembly, the essential parts of which are shown by Figs. 1, 2 and 3 are mounted on or in any suitable chasis (not shown). The channel selecting switch 30, as stated previously, is shown only schematically for the sake of convenience of illustration since it is a standard readily available item. In its usual form it is used as a band selector switch in "all wave" radio sound receivers to change from the broadcast band to the "short wave" bands. It comprises a shaft 87, indicated schematically, which is of suitable length to carry a series of rotary contact groupings in the form of rotary switches marked $S_1$, $S_2$, $S_3$ $S_4$, and $S_5$. Switches $S_1$, $S_3$ and $S_5$ are substantially identical and in their simplest form, as shown, comprise a conductive portion 88 suitably insulated from the shaft 86. Each conductive portion is provided with a contact 89 which connects successively with terminals 90 for the stationary rotary switch contacts. The stationary contacts of the several switch sections $S_1$ to $S_5$ will be designated by reference characters hereinafter. The switches $S_2$ and $S_4$ are so arranged as to maintain a short circuit on a set of lower frequency inductors 91 to 96 for the R. F. amplifier 10 and a set of lower frequency inductors 101 to 106 for the mixer 14, respectively, when the rotary switch is set to select one of the higher frequency channels.

A feature of the invention is that the number of tuned R. F. circuits is limited to two. Tuning capacity is restricted to tube, wiring and switch capacities. The anode 108 of the tube 24 is coupled to the rotary contact 89 through a condenser 109. There is an end inductance 111 consisting of switch, wiring, and tube inductance.

The oscillator output is coupled to the mixer grid 116 by a condenser 114. The anode 112 of the oscillator tube 46 is connected by a condenser 115 to the movable contact 117 of the switch section $S_5$.

A tuning network for the mixer grid is controlled by the portion $S_3$ of the rotary switch 30, and it is coupled to the conductive member 118 of this switch section through a condenser 121. Inductance 122 is an end inductance. A resistor 124 provides damping for the low frequency channeds when they are selected in accordance with the switch position. The coupling for the high frequency channels between the R. F. and mixer grid circuit is provided by a condenser 126.

The high frequency tuning inductances 131 to 135 for the R. F. stage and 141 to 145 for the mixer are similar to the inductances 67 to 71 previously mentioned in describing the oscillator used with the tuner of this invention. These inductances as shown by Fig. 2 comprise a wire or rod 148, generally of "hair-pin" shape. One end may be soldered, for example, or otherwise conductively secured to a ground plate 149 which also appears in Fig. 1 of the drawings. The remaining end of the wire 148 is soldered directly to the corresponding switch terminals 90 as shown schematically in Fig. 1 of the drawings. This same connection is made for each of the inductances 67 to 71, 131 to 135, and 141 to 145 for their respective switch sections $S_5$, $S_1$, and $S_3$. The stationary contacts for the switch sections $S_1$ and $S_3$ are designated 152 and 153. Tuning of the inductances is provided by a slideable bar 155 which is apertured to receive both legs of the inductance 148. The rotary portion of the switch section, which may be the switch section 88 of Fig. 1, is shown fragmentary as cooperating with two contacts connected to terminals 90.

An inductance 150 is arranged to be bridge across the coil 26 when the tuner is set to be responsive to the higher frequency channels receivable with the inductors 131 to 135. A switch comprising a stationary contact 151 and a movable contact 146 is to be closed when a high frequency channel is to be received. The contact 146 may be controlled by the switch 30 for convenience.

The inductances 91 to 96 and 101 to 106 for the lower frequency channels of the R. F. amplifier 10 and the mixer 14, respectively, are arranged to provide "compound coupling." For example, the inductors 91 and 101 are magnetically coupled, and the coupling provided by the condenser 126 opposes that provided by the magnetic field so that the image frequency there is substantially to coupling.

The switch sections $S_2$ and $S_4$ as previously stated short circuit the inductors 91 and 96 and 101 to 106 when a station allocated to a higher frequency channel is being received. As shown schematically, the movable conductive section or contact 150 and 151 of each of these switches is provided with a notch 156 to permit the selected lower frequency inductance in each case to be active.

A suitable source of positive D. C. voltage (not shown) is connected to a terminal indicated schematically at 157 to provide certain electrodes of the tubes with the usual B supply.

From the foregoing it is believed that operation of the tuner Fig. 1 will be apparent. As stated previously, reception of eleven channels is provided by a selection of the position of the switch 30. For example, the inductor 134 may be set by moving its bar 155 to receive assigned channel eleven or channel thirteen and inductor 135 may be adjusted to receive assigned channel 9.

Figure 4:
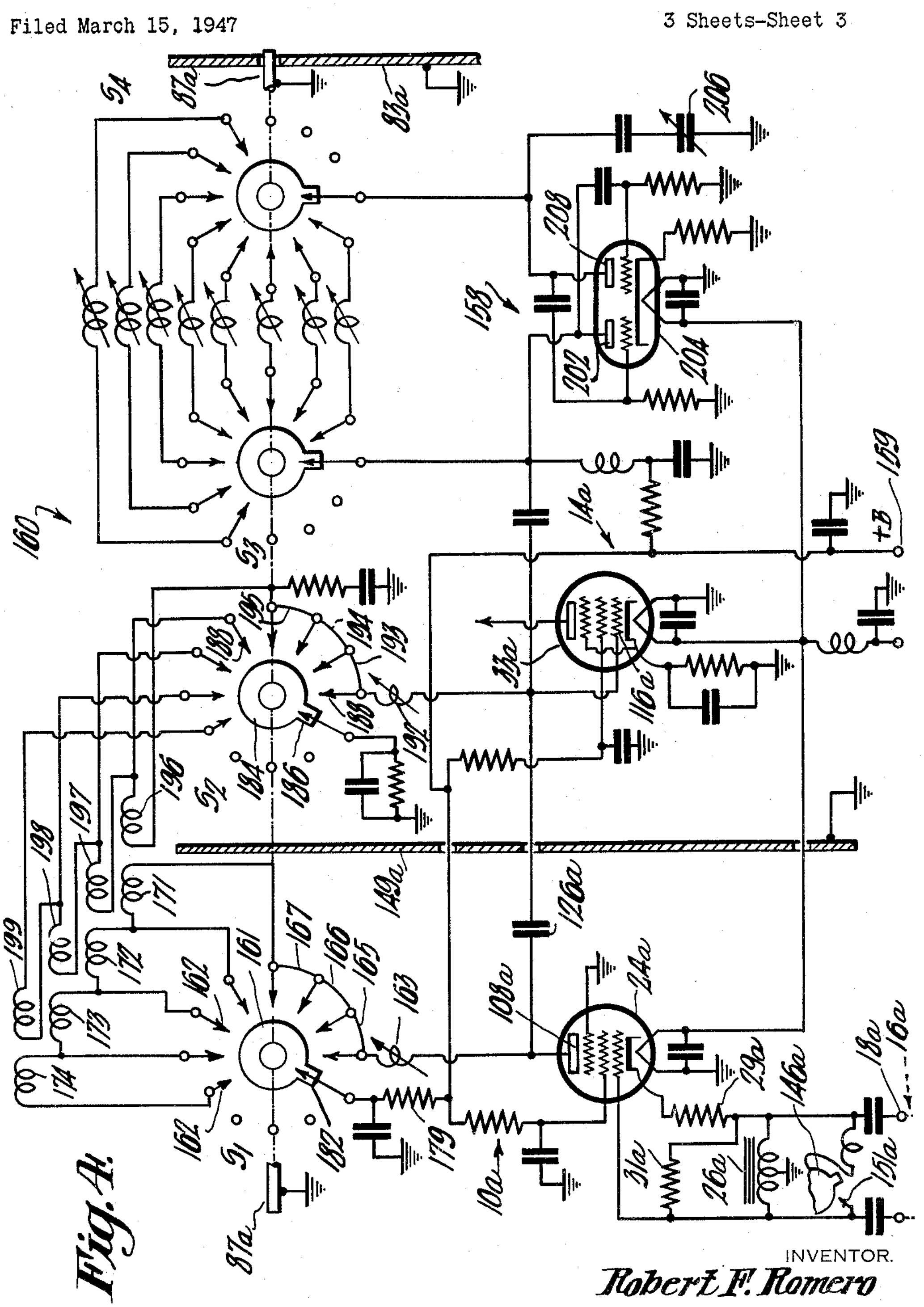
Fig. 4 is a schematic diagram of a modified tuner embodying the invention.

Fig. 4 of the drawings shows a modification of the tuner of Fig. 1 which employs numerous features of the arrangement of Fig. 1. Circuit elements of parts shown by Fig. 4, which are common to Fig. 1, will be designated by the same reference character with the suffix "*a*." The R. F. amplifier 10*a* and the mixer 14*a* are substantially like those shown in Fig. 1 of the drawings. The oscillator 158 is of the balanced type and, therefore, differs from that shown in Fig. 1. It will be understood that the oscillators of Figs. 1 and 4 are interchangeable.

The oscillator 158 is similar to that shown in Letters Patent of the United States to Alfred H. Turner, No. 2,522,973 issued Sepember 9, 1950, and of John C. Achenbach, No. 2,551,228 issued May 1, 1951. The principal differences in Fig. 4 are in the frequency selective networks of the R. F. stage 10*a* and the mixer 14*a*.

The B supply for the R. F. amplifier tube 24a is provided in series with the tuning inductances. This is obtained from a suitable D. C. voltage source (not shown) connected to the point 159.

A rotary switch, indicated in its entirety by reference character 160, comprises four switch sections $S_1$, $S_2$, $S_3$ and $S_4$ and is similar to the switch 30 of Fig. 1. The switch section $S_1$ comprises a rotary conductive member 161 and a series of stationary contacts 162. In the arrangement shown by way of example, reception of eight channels or stations for a given setting of a tuning inductor 163 is possible. The tuning inductor 163 is preferably similar to the inductor previously described in connection with Figs. 1 and 2 of the drawings and is connected to the anode 108a of the R. F. amplifier tube 24a. A series of step inductors 165 to 167 is provided for tuning the highest frequency channels. The inductors 165 to 167 may consist of stampings of appropriate width between adjacent switch contacts 162.

A series of wound inductances in the form of coils 171 to 174 is provided for tuning the lower frequency channels. The terminal 159 for the previously mentioned D. C. source (not shown) is effectively connected through a dropping resistor 179 to the switch rotary conductive member 161.

The grid 116a of the mixer tube 33a is tuned by the switch section $S_2$. This switch section is similar to the section $S_1$ and comprises a switch rotor 184 provided with a switch point 186. This switch point cooperates with a series of stationary switch contacts 188. For purposes of accomplishing the tuning referred to, the grid 116a is connected to the switch point 188 at the highest frequency tuning position of the switch through an inductor 192, which also may be similar to the inductor of Fig. 2 of the drawings. Inductors 193 to 195 serve to tune the high frequency channels and may be in the form of metallic strips similar to the inductors 165 to 167. The lower frequency channels are tuned by the inductances 196 to 199. A coupling condenser 126a performs the same function as the coupling condenser 126 of Fig. 1.

The local oscillator shown in Fig. 1 may be used with the circuit shown in Fig. 4 as well and in the reverse order. It is a balanced push-pull oscillator and may employ a dual triode, for example, a type 6J6 tube. Tuning is done with powdered iron inductances for all of the channels served by the tuner. In the illustrative example, thirteen assigned channels are available.

The injected voltage is taken from one plate 202 of the oscillator tube 204 while the trimmer condenser 206 is connected to ground from the other plate 208.

In order to tune to the even-numbered presently assigned high-frequency channels it is necessary to increase only the inductances of coils 163 and 192. Thus the inductances of 165 to 167 and 193 to 195 need not be adjustable. The coil sets 171 to 174 and 196 to 199 are core tuned and magnetically coupled for a desired band width. A 6 mc. band width is presently desirable for television applications. Except for certain combinations, these are tunable to adjacent channels, but must be adjusted individually. For some combinations, it may be necessary to add capacity across one or more coils. For this reason, it may be desirable to put in six or more of the lower channels which are receivable, thus employing the blank switch positions.

This type of switching has the advantage that all the unused coils are short circuited so that there is no possibility of their acting as resonant traps to the signal or oscillator frequency.

Having now described the invention, what is claimed and desired to be secured by Letters Patent is the following:

1. In a high frequency system, a transmission line, means to supply signals to said transmission line, a vacuum tube comprising a cathode, an anode and a control grid, one leg of said transmission line being connected to said control grid, the other leg of said transmission line being connected to said cathode, said last named connection including a resistor, means comprising an inductance separate from said first named means for connecting both legs of said transmission line to a common voltage reference point in said system in balanced relationship, and an output connection from said anode which is unbalanced with respect to said voltage point.

2. A high frequency tuner comprising a radio frequency amplifier having input terminals, means for tuning said amplifier comprising a plurality of separate inductors and a switch for selecting individual inductors, a transmission line connected to the input terminals of said amplifier in balanced relationship with respect to a voltage reference point, an output connection from said amplifier including said tuning means, said output connection being connected to said switch, and a condenser between said switch and said amplifier.

3. A high frequency tuner comprising a radio frequency amplifier having input terminals, means for tuning said amplifier comprising a plurality of separate inductors, an adjustable inductance, said separate inductors and said adjustable inductance being connected in series, a switch for selecting one or more of said separate inductors in series relationship, a transmission line connected to the input terminals of said amplifier in balanced relationship with respect to a voltage reference point, and an output connection from said amplifier tunable by said switch, said output connection including a condenser connected directly to said amplifier.

ROBERT F. ROMERO.

References Cited in the file of this patent

UNITED STATES PATENTS

| Number | Name | Date |
|---|---|---|
| 1,730,577 | Kolster | Oct. 8, 1929 |
| 1,841,019 | Elliott | Jan. 12, 1932 |
| 1,880,193 | Gebhard | Oct. 4, 1932 |
| 2,009,370 | Hansell | July 23, 1935 |
| 2,069,405 | Kramolin | Feb. 2, 1937 |
| 2,116,696 | DeMonge | May 10, 1938 |
| 2,180,413 | Harvey | Nov. 21, 1939 |
| 2,206,390 | Carlson | July 2, 1940 |
| 2,209,959 | Chittick et al. | Aug. 6, 1940 |
| 2,213,328 | Schaper | Sept. 3, 1940 |
| 2,250,829 | Foster | July 29, 1941 |
| 2,296,107 | Kimball | Sept. 15, 1942 |
| 2,341,346 | Summerhayes | Feb. 8, 1944 |
| 2,413,451 | Johnson | Dec. 31, 1946 |

OTHER REFERENCES

"Radio" for December 1936, pages 23–25, Article by R. S. Kruse.